United States Patent [19]

Yoshida

[11] Patent Number: 4,913,335
[45] Date of Patent: Apr. 3, 1990

[54] METHOD AND APPARATUS FOR DIE BONDING

[75] Inventor: Masaharu Yoshida, Fukuoka, Japan

[73] Assignee: Mitsubishi Denki Kabushiki Kaisha, Japan

[21] Appl. No.: 320,513

[22] Filed: Mar. 8, 1989

[30] Foreign Application Priority Data

Sep. 1, 1988 [JP] Japan ................ 63-221102

[51] Int. Cl.$^4$ .......................................... H01L 21/60
[52] U.S. Cl. .................................. 228/103; 228/105; 228/180.2; 228/6.2; 228/9; 269/903; 221/155; 221/163; 221/167
[58] Field of Search .................... 228/103, 180.2, 62, 228/9, 47; 269/903, 56, 58; 221/155, 163, 167

[56] References Cited

U.S. PATENT DOCUMENTS

| 4,103,814 | 8/1978 | Nishioka | 228/180.2 |
| 4,342,090 | 7/1982 | Caccoma et al. | 228/180.2 |
| 4,696,104 | 9/1987 | Vanzetti et al. | 228/103 |

FOREIGN PATENT DOCUMENTS

| 56-103430 | 8/1981 | Japan . |
| 56-103431 | 8/1981 | Japan . |
| 125837 | 7/1983 | Japan | 228/6.2 |
| 979 | 1/1984 | Japan | 228/6.2 |
| 163649 | 7/1986 | Japan | 228/6.2 |

OTHER PUBLICATIONS

IBM Technical Disclosure Bulletin vol. 28, No. 11, Apr. 1986.
IBM Technical Disclosure Bulletin vol. 29, No. 7, Dec. 1986.
IBM Technical Disclosure Bulletin vol. 30, No. 10, Mar. 1988.

Primary Examiner—Nicholas P. Godici
Assistant Examiner—Samuel M. Heinrich
Attorney, Agent, or Firm—Leydig, Voit & Mayer

[57] ABSTRACT

Disclosed is a method for die bonding, comprising the steps of arranging a wafer having a multiplicity of mutually separated semiconductor chips vertically and near a lead frame which is conveyed horizontally, and picking up each of the semiconductor chips from the wafer and bonding the same onto the lead frame.

15 Claims, 4 Drawing Sheets

METHOD AND APPARATUS FOR DIE BONDING

BACKGROUND OF THE INVENTION

1. Field of the Invention

The present invention relates to a method and an apparatus for die bonding in a process for manufacturing semiconductor devices.

2. Description of the Related Art

FIG. 1 shows a conventional die bonding apparatus disclosed in Japanese Patent Laid-Open No. 60-183733. In the drawing, a wafer 1 is held on a wafer fixing member 10. This wafer 1 is divided into a multiplicity of semiconductor chips 1a, and these semiconductor chips 1a are spaced apart with intervals provided therebetween. A pickup head 2 for lifting i.e., by vacuum, each of the semiconductor chips 1a and for transferring the same onto a lead frame 8 is disposed above the wafer 1. A pickup head controlling means 5 is connected to this pickup head 2. An ITV (industrial television) camera 3 for viewing the semiconductor chip 1a is disposed above the pickup head 2, and a pattern recognition processing means 4 is connected to the ITV camera 3. The wafer fixing member 10 is provided on an X-Y moving stage 6, to which an X-Y moving stage controlling means 7 is connected. A controller 9 is connected to the pattern recognition processing means 4, the pickup head controlling means 5, and the X-Y moving stage controlling means 7, to control these controlling means.

A description will now be given of the operation of this conventional die bonding apparatus. One semiconductor chip 1a on the wafer fixing member 10 is detected by the ITV camera 3, and a signal produced by this ITV camera 3 is processed by the pattern recognition processing means 4 to determine whether or not the semiconductor chip 1a is free of defects. If the semiconductor chip 1a is nondefective, the controller 9 supplies commands to the pickup head controlling means 5 and the X-Y moving stage controlling means 7 to initiate operations. As a result, subsequent operations are carried out consecutively, including the positioning of the nondefective semiconductor chips 1a by the X-Y moving stage 6, the transfer of the nondefective semiconductor chips 1a onto the lead frame 8 and the bonding of them to die pads (not shown) of the lead frame 8 by the pickup head 2.

However, as shown in FIG. 1, although the lead frame 8 is located in the vicinity of the X-Y moving stage 6, the lead frame 8 and the X-Y moving stage 6 are both disposed in horizontally spaced positions. Accordingly, in order to transfer the semiconductor chip 1a, it has been necessary to raise the pickup head 2 vertically from the wafer fixing member 10, then move the pickup head 2 horizontally, and then lower the same to the die pad of the lead frame 8. For this reason, there have been drawbacks in that a long period of time is required in transferring the semiconductor chips 1a with a resultant decline in the production yield of semiconductor devices, and the die bonding apparatus tends to be large in size since the distance over which the semiconductor chip 1a is transferred is relatively long.

SUMMARY OF THE INVENTION

Accordingly, an object of the present invention is to provide a method and an apparatus for die bonding which are capable of improving productivity of semiconductor devices and of effecting die bonding within a small space.

To this end, a method for die bonding in accordance with the present invention comprises the steps of: arranging a wafer having a multiplicity of mutually separated semiconductor chips vertically and near a lead frame which is conveyed horizontally; and picking up each of the semiconductor chips from the wafer and bonding the same onto the lead frame.

In addition, a die bonding apparatus in accordance with the present invention comprises: conveying means for conveying lead frames horizontally; holding means for holding a wafer having a multiplicity of mutually separated semiconductor chips vertically and near the lead frame; and semiconductor chip moving means for picking the semiconductor chips from the wafer held by the holding means and for bonding the same onto the lead frame.

The above and other objects, features and advantages of the present invention will become more apparent from the following detailed description of the invention when read in conjunction with the accompanying drawings.

DESCRIPTION OF THE PREFERRED EMBODIMENTS

Referring now to the accompanying drawings, a description will be given of the preferred embodiments of the present invention.

Figure 1:
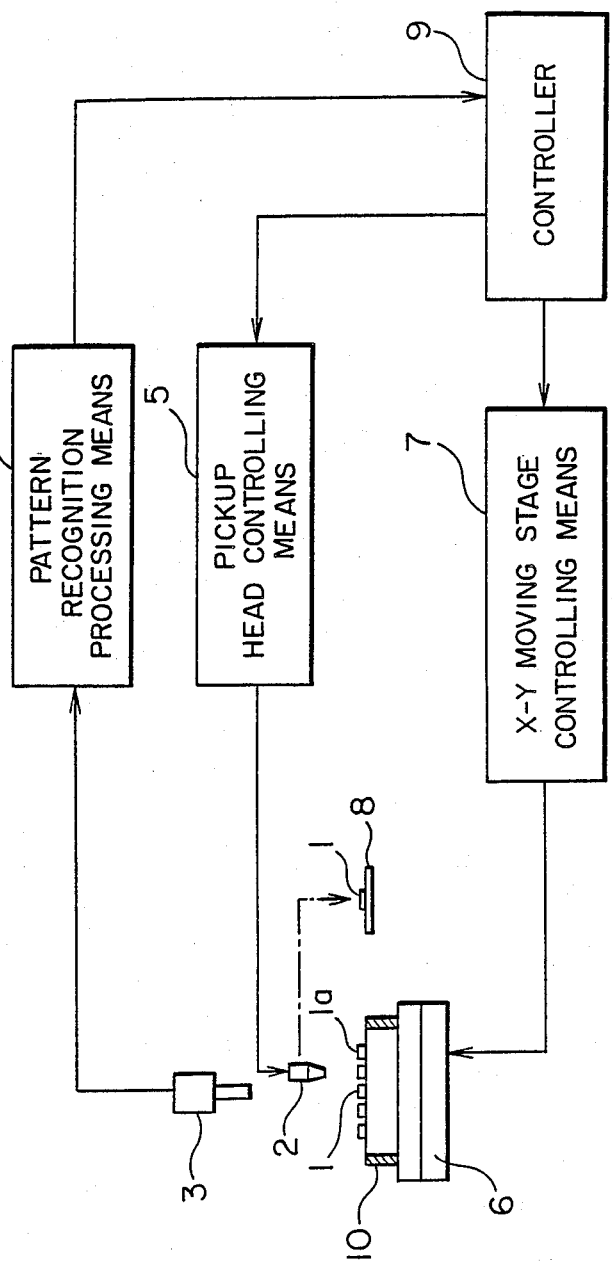
FIG. 1 is a block diagram illustrating a conventional die bonding apparatus.
Figure 2:
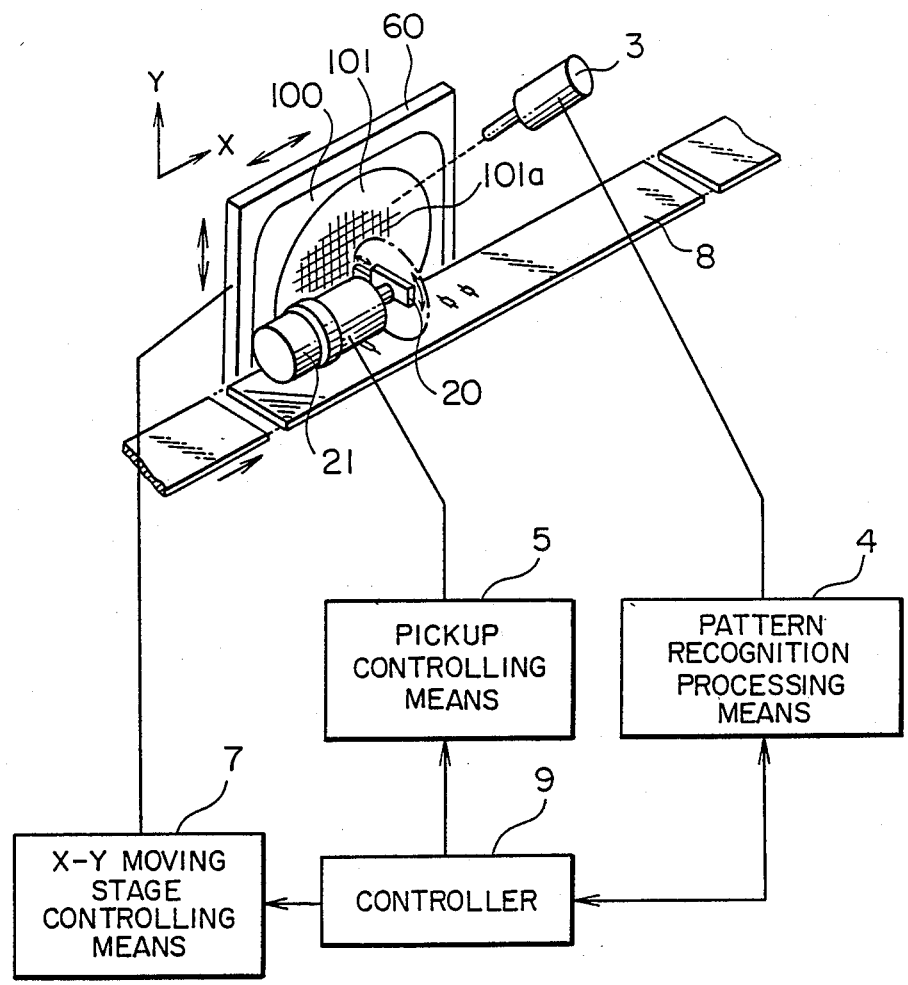
FIG. 2 is a block diagram illustrating a die bonding apparatus in accordance with a first embodiment of the present invention.

In FIG. 2, a lead frame 8 is placed horizontally on a lead frame conveying device (not shown), and the lead frame 8 is moved horizontally in the longitudinal direction thereof by this lead frame conveying device. A servo motor 21 is disposed immediately above this lead frame 8 with its rotary shaft oriented parallel to the longitudinal direction of the lead frame 8. A pickup head 20 is mounted on the rotary shaft of the servo motor 21 in such a manner that the pickup head 20 is rotated within a plane perpendicular to the lead frame 8 by servo motor 21.

An X-Y moving stage 60 is disposed along the side of the lead frame 8 and vertically, and a wafer fixing member 100 is fixed on this X-Y moving stage 60. In addition, an ITV camera 3 is disposed above the lead frame 8, and a pattern recognition processing means 4 is connected to this ITV camera 3. Also, a pickup controlling means 5 is connected to the pickup head 20 and the servo motor 21, while an X-Y moving stage controlling means 7 is connected to the X-Y moving stage 60. A controller 9 is connected to the pattern recognition processing means 4, the pickup controlling means 5, and the X-Y moving stage controlling means 7, to control these controlling means.

The operation of this first embodiment will be described hereinafter. First, a wafer 101 is held by a wafer fixing member 100. This wafer 101 is split into a multiplicity of semiconductor chips 101a which are mutually spaced apart at intervals provided therebetween. In addition, a chip sorting test has been conducted on the wafer 101 and the defective chips 101a are provided with a bad mark. One of the semiconductor chips 101a of the wafer 101 is detected by the ITV camera 3, and a signal produced by this ITV camera 3 is processed by the pattern recognition processing means 4 to determine whether or not the semiconductor chip 101a is free of defects on the basis of an existence of the bad mark on the chip 101a. If the semiconductor chip 101 is free of defects, a signal indicating that fact is transmitted from the pattern recognition processing means 4 to the controller 9, which supplies commands to the pickup controlling means 5 and the X-Y moving stage controlling means 7 to initiate operations.

In other words, the X-Y moving stage 60 is moved by the X-Y moving stage controlling means 7 to move the wafer fixing member 100 in the X- and Y-directions within a vertical plane, thereby causing the nondefective semiconductor chip 101a to be located at a pickup position. The semiconductor chip 101a which has been moved to the pickup position is picked up with a vacuum by the pickup head 20 operated by the pickup controlling means 5. Subsequently, the servo motor 21 is driven by the pickup controlling means 5, to rotate the pickup head 20 by 90° to face downwards. As a result, the semiconductor chip 101a is located immediately above a die pad (not shown) of the lead frame 8. Furthermore, the semiconductor chip 101a is lowered by the pickup head 20 and is bonded to the die pad.

In a case where the semiconductor chip 101a detected by the ITV camera 3 is determined to be defective as a result of a determination by the pattern recognition processing means 4, the picking up of the semiconductor chip 101a by the pickup head 20 is not carried out, and the X-Y moving stage 60 is moved by the X-Y moving stage controlling means 7 to determine whether or not an ensuing semiconductor chip 101a is free of defects.

In accordance with the first embodiment, the semiconductor chip 101a picked up by the pickup head 20 can be located immediately above the die pad by merely rotating it 90°, whereby the period of time required for transferring the semiconductor chip 101a can be reduced appreciably. Furthermore, since the transferring distance of the semiconductor chip 101a is shortened, it is possible to realize a compact die bonding apparatus.

Figure 3:
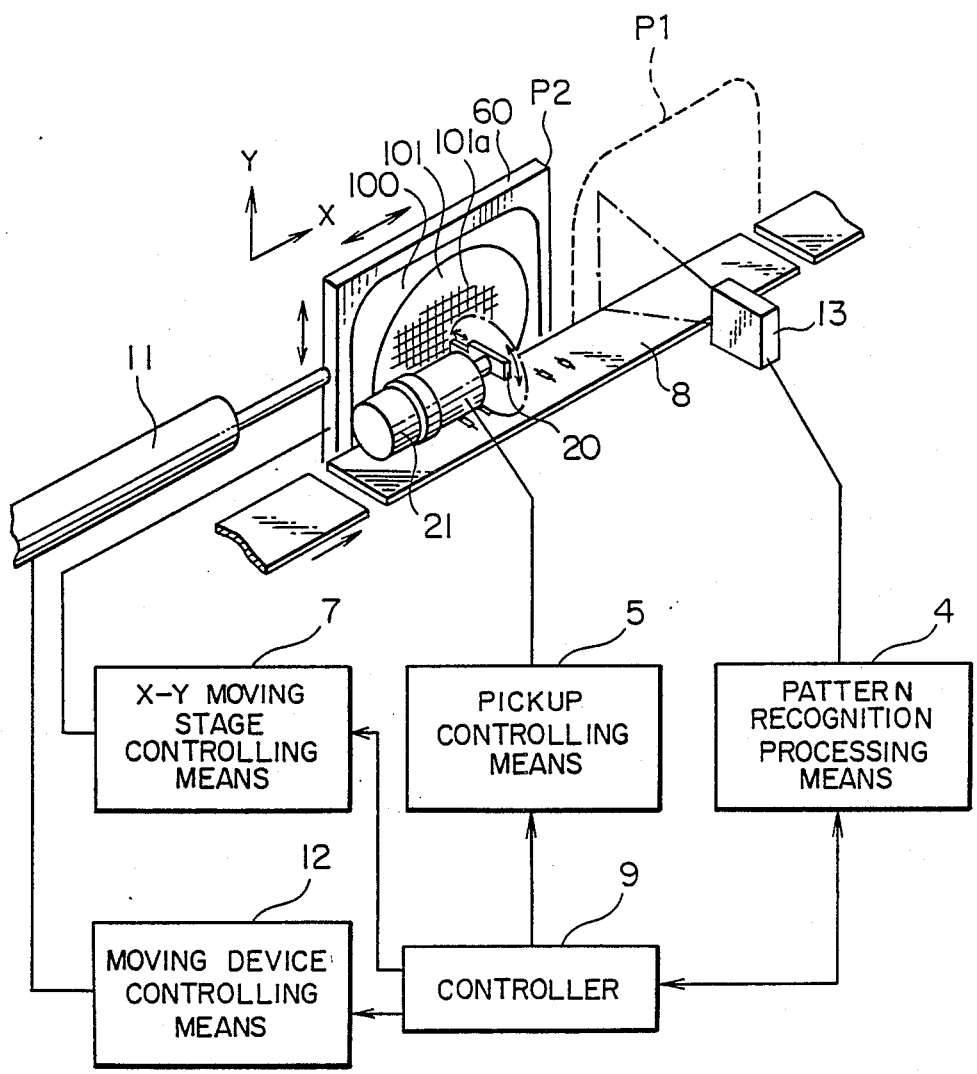
FIG. 3 is a block diagram illustrating a die bonding apparatus in accordance with a second embodiment of the present invention.

Referring now to FIG. 3, a description will now be given of a second embodiment of the present invention. In this embodiment, an X-Y moving stage moving device 11 is provided for moving the X-Y moving stage 60 between a first position P1 for recognizing the semiconductor chip 101a and a second position P2 for bonding. This X-Y moving stage moving device 11 is constituted of a cylinder or the like, and is connected to the controller 9 via a moving device controlling means 12 for driving the X-Y moving stage moving device 11 on the basis of a control signal from the controller 9. In addition, instead of the ITV camera 3 of the first embodiment, a recognition sensor 13 such as an ITV camera directed toward the first position P1 of the X-Y moving stage 60 is connected to the pattern recognition processing means 4. This recognition sensor 13 simultaneously detects one or several rows of semiconductor chips 101a arranged in a vertical direction (Y-direction) in the wafer 101 fixed to the wafer fixing member 100 of the X-Y moving stage 60 located at the first position P1.

In operation, the X-Y moving stage 60 with the wafer 101 fixed to the wafer fixing member 100 is moved by the the moving device 11 to the first position P1, and the detection of all the semiconductor chips 101a of the wafer 101 is carried out at this position P1 by the sensor 13 and the X-Y moving stage controlling means 7. Namely, after one or several rows of semiconductor chips 101a arranged in the vertical direction (Y-direction) have been detected by the sensor 13, the X-Y moving stage 60 is moved horizontally (X-direction) by the X-Y moving stage controlling means 7. Subsequently, as this operation is repeated, all the semiconductor chips 101a of the wafer 101 are detected. Upon receiving a detection signal from this sensor 13, the pattern recognition processing means 4 determines whether or not each of the semiconductor chips 101a is free of defects, and transmits the results of the determinations to the controller 9.

Next, upon receiving a command from the controller 9, the moving device controlling means 12 causes the moving device 11 to move the X-Y moving stage 60 to the second position P2. Furthermore, the controller 9 supplies commands to the pickup controlling means 5 and the X-Y moving stage controlling means 7 to initiate the picking-up and bonding operations with respect to only the nondefective semiconductor chips 101a on the basis of the results transmitted from the pattern recognition processing means 4.

In other words, the X-Y moving stage 60 is driven by the X-Y moving stage controlling means 7 to move the nondefective semiconductor chip 101a to the pickup position. The semiconductor chip 101a which has been moved to the pickup position is picked up by the pickup head 20, and is bonded onto the die pad of the lead frame 8. As this operation is repeated, only the nondefective semiconductor chips 101a are bonded.

Thus, in accordance with the second embodiment, since the determination of the state [defective or nondefective] of the semiconductor chips 101a is carried out at the first position P1 in advance, the picking up and bonding of the semiconductor chip 101a can be effected continuously at the second position P2, so that the productivity of the semiconductor devices improves.

It should be noted that, if a sensor which is capable of simultaneously detecting all of the semiconductor chips 101a of the wafer 101 located at the first position P1 is used as the recognition sensor 13, the detection and recognition of the semiconductor chips 101a can be facilitated, and the productivity of the semiconductors can be further enhanced.

Figure 4:
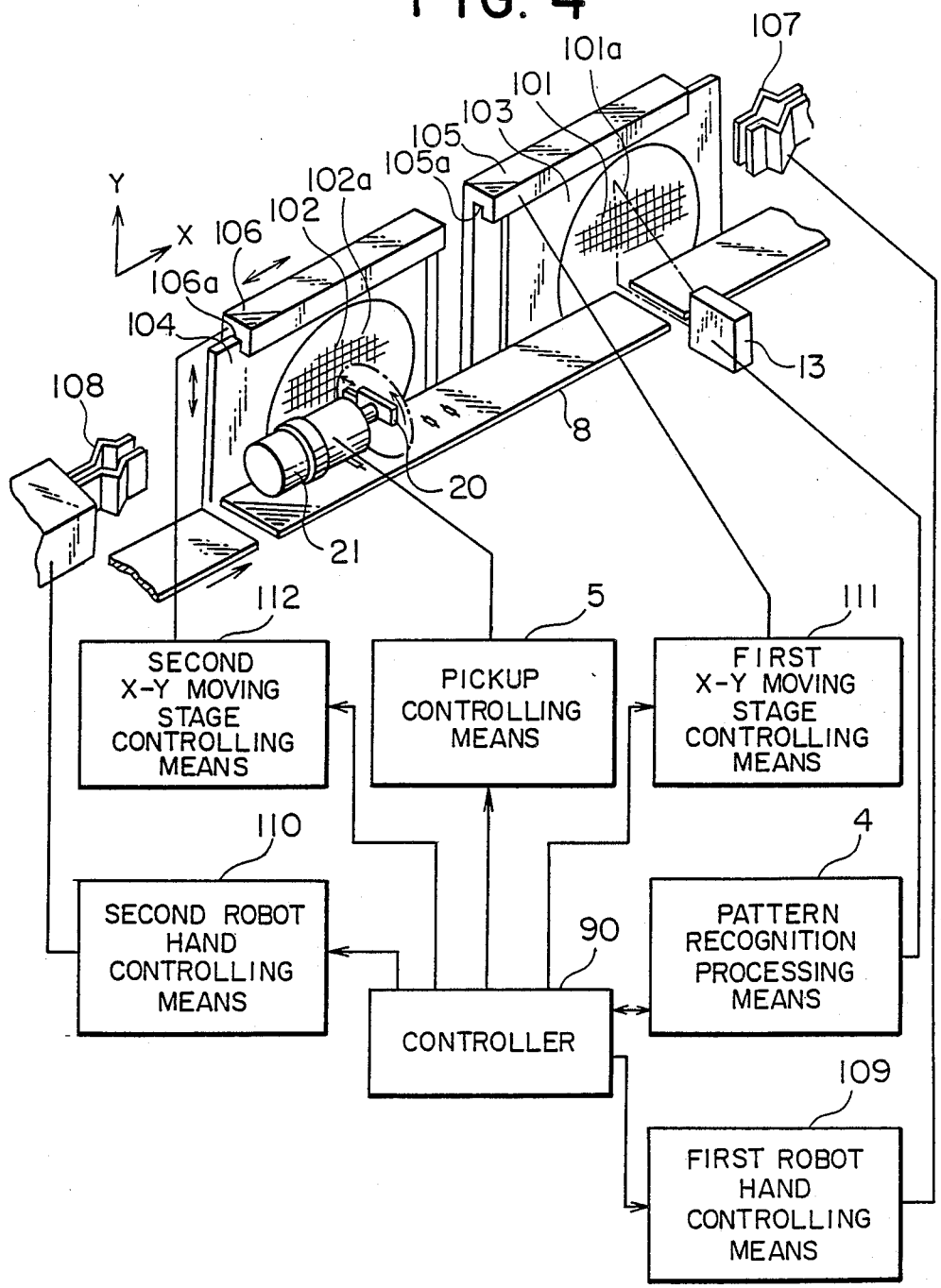
FIG. 4 is a block diagram illustrating a die bonding apparatus in accordance with a third embodiment of the present invention.

Referring now to FIG. 4, a description will be given of a third embodiment of the present invention. In this embodiment, a first X-Y moving stage 105 and a second X-Y moving stage 106 are vertically disposed along the side of the lead frame 8 and in a row in the longitudinal direction of the lead frame 8. The X-Y moving stages 105 and 106 are respectively provided with guides 105a and 106a, which are constituted by U-shaped grooves for securing wafer fixing members 103 and 104, respectively. The X-Y moving stages 105 and 106 move wafers 101 and 102 fixed to the wafer fixing members 103 and 104, in the X- and Y-directions within a vertical plane. First and second robot hands 107 and 108 for gripping and moving the wafer fixing members 103 and 104 secured to the X-Y moving stages 105 and 106 are respectively provided in the vicinity of the first and second X-Y moving stages 105 and 106. In addition, a recognition sensor 13 which is similar to that of the second embodiment is disposed facing the first X-Y moving stage 105. A servo motor 21 is disposed in the vicinity of the second X-Y moving stage 106, and the pickup head 20 is mounted on the shaft of this servo motor 21.

Furthermore, first and second robot hand controlling means 109 and 110 are connected to the first and second robot hands 107 and 108, and first and second X-Y moving stage controlling means 111 and 112 to the first and second X-Y moving stages 105 and 106, respectively. In addition, a controller 90 is connected to the first and second robot hand controlling means 109 and 110, the first and second X-Y moving stage controlling means 111 and 112, the pattern recognition processing means 4, which is connected to the recognition sensor 13, and to the pickup controlling means 5, which is connected to the pickup head 20 and the servo motor 21.

In operation, the wafer fixing member 104 is first mounted on the first X-Y moving stage 105 by means of the first robot hand 107 on the basis of a command from the first robot hand controlling means 109. The wafer 102 is disposed on this wafer fixing member 104, and all the semiconductor chips 102a of the wafer 102 are detected by the recognition sensor 13 and the first X-Y moving stage controlling means 111 in the same way as the second embodiment. Upon receiving a detection signal from the sensor 13, the pattern recognition processing means 4 determines the state [defective or non-defective] of each of the semiconductor chips 102a, and transmits its results to the controller 90.

Subsequently, upon receiving a command from the controller 90, the first robot hand controlling means 109 transfers the wafer fixing member 104 mounted on the first X-Y moving stage 105 to the second X-Y moving stage 106 by using the first robot hand 107. Furthermore, the controller 90 supplies commands to the pickup controlling means 5 and the second X-Y moving stage controlling means 112 to initiate the picking-up and bonding operations with respect to only the nondefective semiconductor chips 102a on the basis of the results sent from the pattern recognition processing means 4.

The picking up of the semiconductor chips 102a of the wafer 102 is effected on the second X-Y moving stage 106, while the first robot hand controlling means 109 mounts the wafer fixing member 103 with an ensuing wafer 101 fixed thereto onto the first X-Y moving stage 105 by means of the first robot hand 107. The semiconductor chips 101a of this wafer 101 are then detected by the sensor 13.

After all the nondefective semiconductor chips 102a of the wafer 102 on the second X-Y moving stage 106 are picked up and bonded, a control signal is delivered from the controller 90 to the second robot hand controlling means 110, and the second robot hand 108 controlled by this robot hand controlling means 110 takes out the wafer fixing member 104 together with the wafer 102 from the the second X-Y moving stage 106.

Thus, in accordance with the third embodiment, since the operation of determining the state [defective or nondefective] of the semiconductor chips on the first X-Y moving stage 105 and the picking up and bonding operations of the semiconductor chips on the second X-Y moving stage 106 are carried out independently and simultaneously, the productivity of the die bonding can be enhanced remarkably.

What is claimed is:

1. A method of die bonding comprising:
   orienting a semiconductor wafer in a first plane, the wafer including a multiplicity of mutually separated chips, near a lead frame which is conveyed in a second plane orthogonal to said first plane;
   determining whether each of the semiconductor chips is defective or non-defective at a first position of said wafer;
   moving the wafer to a second position in the first plane along a direction lying in the second plane; and
   picking up each of the non-defective semiconductor chips from the wafer and bonding each of the non-defective chips onto a respective lead frame.

2. A method according to claim 1 including rotating a semiconductor chip in the first plane, after being picked up from the respective wafer, for bonding onto said lead frame.

3. A die bonding apparatus comprising:
   conveying means for conveying lead frames in a second plane;
   holding means for holding a semiconductor wafer in a first plane orthogonal to the second plane near the lead frames, the wafer including a multiplicity of mutually separated chips;
   moving means for moving said holding means between first and second positions along a direction lying in the second plane;
   a sensor for optically detecting the semiconductor chips when said holding means is in the first position and for generating a sensor signal in response to the detection of each chip;
   pattern recognition means for determining, in response to the sensor signal, whether each of the chips is non-defective or defective; and
   semiconductor chip moving means for picking up each of the non-defective semiconductor chips from the wafer held by said holding means in the second position and for bonding each of the non-defective chips onto a respective lead frame.

4. A die bonding apparatus according to claim 3 wherein said holding means includes an X-Y moving stage for moving said wafer within the first plane.

5. A die bonding apparatus according to claim 3 wherein said semiconductor chip moving means includes a pickup head for picking up a said semiconductor chip and a motor for rotating said pickup head.

6. A die bonding apparatus according to claim 5 wherein said motor rotates said pick up head within a third plane perpendicular to the first and second planes.

7. A die bonding apparatus according to claim 3, wherein said optical sensor is an ITV camera.

8. A die bonding apparatus according to claim 3, wherein said moving means is a cylinder.

9. A die bonding apparatus comprising:
   conveying means for conveying lead frames in a second plane;
   first and second holding devices disposed serially along a direction lying in the second plane near the lead frames, said first and second holding devices for holding a semiconductor wafer in a first plane orthogonal to the second plane, the wafer including a multiplicity of mutually separated chips;
   a sensor for optically detecting the semiconductor chips when the wafer is held by said first holding device and for generating a sensor signal in response to the detection of each chip;

pattern recognition means for determining, in response to the sensor signal, whether each of the chips is non-defective or defective; and semiconductor chip moving means, in the vicinity of said second holding device, for picking up each of the non-defective semiconductor chips from the wafer held by said second holding device and for bonding each of the non-defective chips onto a respective lead frame.

10. A die bonding apparatus according to claim 9 wherein said semiconductor chip moving means includes a pick up head for picking up a semiconductor chip and a motor for rotating said pick up head.

11. A die bonding apparatus according to claim 10 wherein said motor rotates said pick up head within a third plane perpendicular to the first and second planes.

12. A die bonding apparatus according to claim 9 wherein said optical sensor is an ITV camera.

13. A die bonding apparatus according to claim 9 comprising wafer transferring means for transferring said wafer held by said first holding device to said second holding device.

14. A die bonding apparatus according to claim 9 wherein said first and second holding devices include respectively first and second X-Y moving stages for moving said wafer within the first plane perpendicular to said lead frame.

15. A die bonding apparatus according to claim 13 wherein said wafer transferring means is a robot hand.

* * * * *

UNITED STATES PATENT AND TRADEMARK OFFICE
CERTIFICATE OF CORRECTION

PATENT NO. : 4,913,335
DATED : April 3, 1990
INVENTOR(S) : Yoshida

It is certified that error appears in the above-identified patent and that said Letters Patent is hereby corrected as shown below:

Column 8, lines 13 and 14, delete "perpendicular to said lead frame".

Signed and Sealed this

Twenty-seventh Day of August, 1991

Attest:

HARRY F. MANBECK, JR.

Attesting Officer

Commissioner of Patents and Trademarks